United States Patent [19]
Holzschuh

[11] Patent Number: 5,580,585
[45] Date of Patent: Dec. 3, 1996

[54] HYDRAULIC OPERATIONAL SYSTEM FOR AN INJECTION MOLDING MACHINE

[75] Inventor: Johann Holzschuh, Meinerzhagen, Germany

[73] Assignee: Battenfeld GmbH, Meinerzhagen, Germany

[21] Appl. No.: 325,729

[22] Filed: Oct. 19, 1994

[30] Foreign Application Priority Data

Oct. 22, 1993 [DE] Germany ............ 43 35 328.2

[51] Int. Cl.$^6$ ............................................ B29C 45/82
[52] U.S. Cl. ................... 425/145; 60/484; 425/149
[58] Field of Search ........................ 60/484; 425/145, 425/149, 556

[56] References Cited

U.S. PATENT DOCUMENTS

| | | | |
|---|---|---|---|
| 4,100,822 | 7/1978 | Rosman | 60/484 |
| 4,544,340 | 10/1985 | Hehl | 425/589 |
| 4,988,273 | 1/1991 | Faig et al. | 425/149 |
| 5,253,997 | 10/1993 | Kamada | 425/556 |

FOREIGN PATENT DOCUMENTS

| | | |
|---|---|---|
| 0403041A3 | 12/1990 | European Pat. Off. . |
| 0403041 | 12/1990 | European Pat. Off. . |
| 0464286A2 | 1/1992 | European Pat. Off. . |
| 0464286A3 | 1/1992 | European Pat. Off. . |
| 2472969 | 7/1981 | France . |
| 3704756 | 8/1988 | Germany . |

OTHER PUBLICATIONS

Hydraulic Injection Molding Machinery, Feb. 1994.
Webster's Ninth New Collegiate Dictionary, p. 469, 1986.

*Primary Examiner*—Tim Heitbrink
*Attorney, Agent, or Firm*—Anderson, Kill, Olick P.C.

[57] ABSTRACT

A hydraulic operational system for an injection molding machine, including a hydraulic line network, a plurality of hydraulic drives for driving different components of the injection molding machine, a plurality of directional control valves, for connecting the hydraulic drives with the network, a constant delivery pump for supplying the hydraulic line network with hydraulic fluid, and a steplessly controlled electric motor or a multi-stage electric motor for driving the constant delivery pump, and a maximum driving speed of which is controlled so that it corresponds to the hydraulic pump operation at which the hydraulic pump provides at least one of a delivery volume and a hydraulic fluid pressure corresponding to the at east one of a maximum amount of the hydraulic fluid and a maximum pressure of the hydraulic fluid required for operating all of the plurality of hydraulic drives.

15 Claims, 1 Drawing Sheet

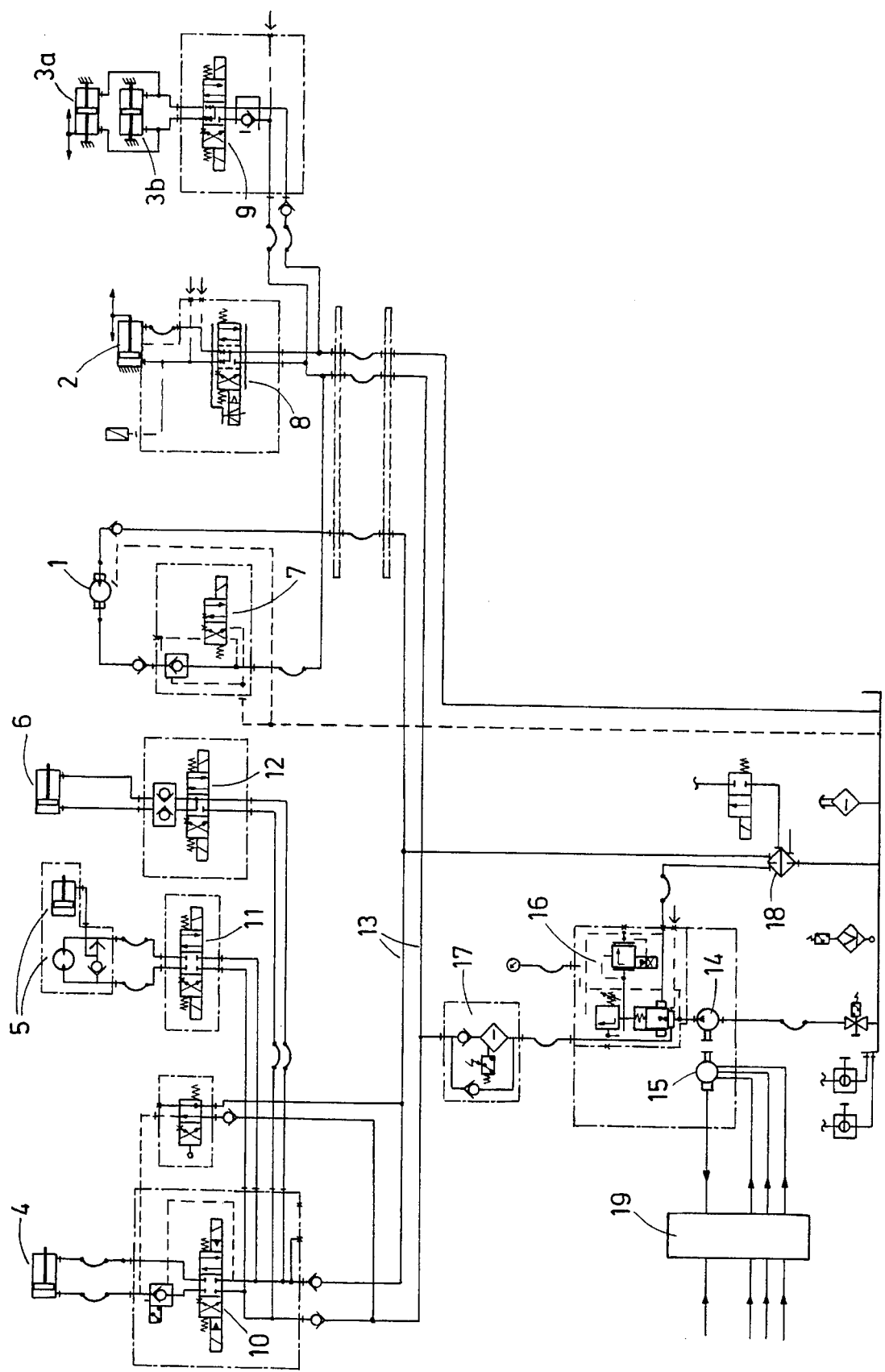

HYDRAULIC OPERATIONAL SYSTEM FOR AN INJECTION MOLDING MACHINE

BACKGROUND OF THE INVENTION

The invention relates to a hydraulic operational system for an injection molding machine and including a hydraulic pump for supplying a hydraulic fluid to hydraulic line network, a plurality of hydraulic drives or cylinders for driving components of the injection molding machine, and a plurality of valves which connect respective hydraulic drives with the hydraulic line network.

The discontinuous operations of the injection molding machine take place in sequence in accordance with separate displacements of the hydraulic drives which are characterized by different displacement paths.

The operation of the injection molding machine requires that the hydraulic flow be adapted to respective different displacements of the hydraulic drives. It is conventional to so influence the displacements of each separate hydraulic cylinder that an acceleration or deceleration of it takes place, in particular, at the beginning and end phases of their displacement. As a result, a non-uniform displacement takes place.

In conventional hydraulic operational systems, different methods and means are employed for controlling the flow of the hydraulic fluid to the hydraulic cylinders. E.g. in some conventional systems, flow control valves are used for bleeding-off a portion of a pump output flow. The flow control valve can also be provided in the main flow in systems that includes an accumulator. Also, hydraulic pumps having a variable flow rate are used in the conventional systems.

However, all known conventional hydraulic operational systems are characterized by a rather poor efficiency. Thus, the pumps with a variable flow rate are characterized by an increased noise, which has to be reduced by employing additional means.

Accordingly, an object of the invention is a hydraulic operational system of the above-described type in which the drawbacks of the conventional hydraulic systems are eliminated.

Another object of the invention is a hydraulic operational system in which the noise is substantially eliminated.

A further object of the invention is to provide a hydraulic operational system having reduced operating costs.

SUMMARY OF THE INVENTION

These and other objects of the invention, which will become apparent hereinafter, are achieved by providing a hydraulic operational system in which the hydraulic pump is a constant delivery pump which is so selected that is capable of providing at least one of a delivery volume of the hydraulic fluid and a hydraulic fluid pressure corresponding at least to at least one of a maximum amount of the hydraulic fluid and a maximum pressure of the hydraulic fluid required for operating all of the plurality of hydraulic drives, and in which a maximum driving speed of the pump-driving electric motor, which is one of a steplessly regulated electric motor, and a multistage electric motor is controlled so that it corresponds to the hydraulic pump operation at which the hydraulic pump provides the at least one of a delivery volume and a hydraulic fluid pressure corresponding to the at least one of a maximum amount of the hydraulic fluid and the maximum pressure of the hydraulic fluid required for operating all of the plurality of hydraulic drives.

The speed regulation of the electric motor can be effected as a two-magnitude control, e.g. a pressure-flow control. With this type of speed control, two complete control circuits are connected with each other by a linking circuit, so that they mutually influence each other.

In accordance with a preferred embodiment of the invention, the electric motor is a vector-controlled or frequency-controlled three-phase squirrel-cage electric motor or a three phase servomotor. When the electric motor is a vector-controlled three-phase squirrel-cage electric motor it can be equipped with a speed sensor. However, if the reduction in operational costs is important, the speed sensor can be dispensed with.

For all cases of speed control, it is important to insure that the electric motor provides for different speeds of the hydraulic pump and a smooth transition from one speed to another to insure a different flow rate, which is necessary for effecting the displacement of the hydraulic drives with required acceleration or deceleration.

Advantageously, according to the present invention, an electrically controlled pressure-limiting and unloading valve or a proportional pressure-limiting valve is provided directly downstream of the constant delivery pump, so that an optimal pressure control is provided, in addition to the optimal flow control.

Further, according to the present invention, there is provided a programmable control ramp circuit for controlling the rotational speed of the pump driving electric motor and which operation is based on a time/speed function, whereby the beginning and end phases of the displacement of separate drives are favorably influenced.

From the structural point of view, the hydraulic pump, the constant delivery pump, is advantageously mounted directly on the flange of the pump driving electric motor. Alternatively, the pump and the electric motor can be mounted on a common support.

According to the invention, advantageously, in a unit of time, only that amount of the hydraulic fluid is supplied into the hydraulic system which is necessary for the operation of hydraulic drives operable at that time. This increases the overall efficiency of the hydraulic system while reducing the operational costs and losses of the hydraulic fluid. The plurality of hydraulic drives of the hydraulic system of the present invention includes a closing cylinder, a height adjustment, hydraulic motor, an ejection cylinder, an injection cylinder, a screw-driving cylinder and at least one nozzle displacement cylinder.

According to the invention, the driving speed of the one of a steplessly regulated electric motor and multi-stage electric motor is controlled within a speed range of 10–2500 revolution/min and, preferably within the range of 120–1800 revolution/min.

The control means for controlling the driving speed of the one of a steplessly regulated electric motor and a multistage electric motor operates in accordance with set point/control point comparison. The control means comprises at least one of initiators, probes, and position sensors for determining conditions of at least one of the hydraulic drives and the directional control valves.

Further, because the pressure-limiting and unloading valve is located immediately downstream of the hydraulic pump, the quality coefficient of the pressure control circuit is significantly increased. Due to very good overall efficiency of the hydraulic system, only a minimal cooling of the hydraulic fluid is needed. This further reduces the operational costs of the hydraulic system of the present invention.

BRIEF DESCRIPTION OF THE DRAWINGS

The features and objects of the present invention will become more apparent, and the invention itself will be best understood from the following detailed description of the preferred embodiment when read with reference to the accompanying drawings, wherein:

Single FIGURE shows a schematic diagram of a hydraulic operational system for an injecting molding machine according to the present invention.

DETAILED DESCRIPTION OF THE PREFERRED EMBODIMENT

An injection molding machine (not shown), in which the hydraulic operational system according to the present invention is used, includes a hydraulic motor 1 for driving the screw, an injection cylinder 2, and at least one nozzle displacement cylinder 3a or 3b.

A mold clamping unit (also not shown) of the injection molding machine is provided with a closing cylinder 4, height adjustment arrangement 5, and an ejection cylinder 6.

The drive components 1, 2, 3a, 3b, 4, 5 and 6 are all formed as hydraulic drives and are connected to a hydraulic line network by respective directional control valves 7, 8, 9, 10, 11 and 12.

The hydraulic operational system according to the present invention further includes a hydraulic pump 14, which is driven by an electric motor 15. The output pressure of the hydraulic pump 14 is controlled by an electrically actuated pressure-limiting and unloading valve 16 which functions as a proportional pressure-limiting valve and controls flow of the hydraulic fluid to the hydraulic line network 13. An oil filter 17 is provided downstream of the pressure-limiting valve 16 and upstream of the inlet of the hydraulic line network 13. An oil cooler 18 is connected to the hydraulic line network 13 in the region of its inlet, which is fed from the pump 14, and to the pressure-limiting valve 16.

The hydraulic operational system according to the present invention is further provided with a programmable control element 19 having a set/control point input. The control element 19 controls the rotational speed of the electric motor 15 and thereby the output of the hydraulic pump 14.

In the hydraulic operational system according to the present invention, a constant delivery pump is used as the hydraulic pump 14. The hydraulic pump 14 is formed, preferably, as an internal gear pump. The dimensions of the hydraulic pump 14 are so selected that it is able to provide an output volume and/or a maximum output pressure corresponding to the maximum amount of hydraulic fluid necessary for operating the hydraulic drives 1 through 6.

The electric motor 15 for driving the hydraulic pump 14 is a stepless electric motor or at least a multistage adjustable electric motor. Such a motor can have a controlled rotational speed range between 10 and 2500 revolutions per minute, and is preferably controlled in a speed range of 120 –1800 revolutions per minute.

If a multistage electric motor is used as the electric motor 15 for driving the pump 14, it should have preferably 99 speed stages.

It is especially advantageous to use a vector-regulated three-phase squirrel-cage electro-motor for driving the hydraulic pump 14. However, a frequency-regulated three-phase squirrel-cage electro-motor can also be used for driving the hydraulic pump 14. It is also possible to drive the hydraulic pump 14 with a three-phase servomotor.

The operation of the proportional pressure-limiting valve 16 can likewise be controlled by the control element 19. The electric motor 15 is controlled by the control element 19 via a programmable control ramp circuit, the operation of which is based on a time/speed function. The control circuit which is built in the control element 19 not only controls passing from one speed stage to another, but also is capable of influencing the beginning and end phases of movement of each hydraulic drive 1 through 6.

The control circuit of the control element 19 can also be used for adjusting the proportional pressure-limiting valve 16 to optimize the flow of the hydraulic fluid into the hydraulic line network 13. It is also contemplated to provide the different hydraulic drives 1–6 and/or the directional control valves 7–12, which are associated with the hydraulic drives 1–6, with initiators or probes and/or position sensors, which would generate control signals in accordance with which the control element 19 would control the operation of the electric motor 15.

The above-described hydraulic operational system for an injection molding machine makes it possible to supply into the hydraulic line network 13 exactly that amount of the hydraulic fluid, and with exactly that pressure which are necessary for actuating and for stopping the hydraulic drives. This permits to substantially reduce the losses of the hydraulic fluid and to efficiently operate the hydraulic operational system. The above-described control of the hydraulic operation system according to the present invention insures its quite operational and permits its utilization with minimal operational costs. The hydraulic system according to the present invention is particularly cost effective when, the electric motor 15 for driving the hydraulic pump 14 has a multi-stage speed control, e.g., it is operated with a 99-stage control, which, at that, can be provided with small costs of control.

It is further to be pointed out that providing the proportional pressure-limiting valve directly downstream of the hydraulic pump permits to especially advantageously influence the quality coefficient of the pressure control circuit.

From the economical point of view, it is especially advantageous when the hydraulic pump 14 is mounted directly on the flange of the electric motor 15.

Finally, it should be pointed out that the arrangement of the hydraulic drives 1 through 6 and their associated directional control valves 7–12 is shown in the drawing figure only as an exemplary layout. If necessary, another arrangement than that shown in the drawing, can be used. Essential for the hydraulic operational system according to the present invention is that the output volume necessary for the displacement of different hydraulic drives 1 through 6 and/or the hydraulic fluid pressure is insured by providing an electric motor for the hydraulic pump, which is capable of a smooth transition from one speed to another speed.

The separate hydraulic drives of the hydraulic operational system according to the present invention not only have different structural and power sizes, but also require for their operation, different pressure ranges, and the hydraulic operational system is capable of accommodating these different hydraulic drives.

Though the present invention was shown and described with reference to a preferred embodiment, various modifications thereof will be apparent to those skilled in the art and, therefore, it is not intended that the invention be limited to the described embodiment and/or details thereof, and departures may be made therefrom within the spirit and scope of the appended claims.

What is claimed is:

1. A hydraulic operational system for an injection molding machine, comprising:

a hydraulic line network;

a plurality of hydraulic drives having different displacements for intermittently driving different components of the injection molding machine during operation of the machine;

a plurality of directional control valves, which correspond to the plurality of hydraulic drives, for connecting the hydraulic drives with the network.

a constant delivery pump for supplying the hydraulic line network with hydraulic fluid, the constant delivery pump being selected so that it is capable to provide at least one of a delivery volume of the hydraulic fluid and a hydraulic fluid pressure corresponding, respectively, to a least one of a maximum amount of the hydraulic fluid and a maximum pressure of the hydraulic fluid required for operating all of the plurality of hydraulic drives;

an electric motor for driving the constant delivery pump; and wherein a maximum driving speed of the steplessly regulated electric motor is controlled so that the maximum driving speed corresponds to the hydraulic pump operation at which the hydraulic pump provides the at least one of a delivery volume and a hydraulic fluid pressure corresponding to the at least one of a maximum amount of the hydraulic fluid and the maximum pressure of the hydraulic fluid required for operating all of the plurality of hydraulic drives, and wherein a speed of the electric motor is controlled proportional to at least one of an amount of the hydraulic fluid and a pressure of the hydraulic fluid required for operating hydraulic drives actuated at a particular time.

2. A hydraulic operational system as set forth in claims 1, wherein the electric motor is one of a steplessly controlled electric motor and a multistage electric motor.

3. A hydraulic operational system as set forth in claim 2, wherein the constant delivery pump is an internal gear pump.

4. A hydraulic operational system as set forth in claim 2, wherein the one of a steplessly controlled electric motor and a multistage electric motor is a vector-regulated three-phase squirrel-cage electric motor.

5. A hydraulic operational system as set forth in claim 2, wherein the one of a steplessly controlled electric motor and a multi-stage electric motor is a frequency-regulated three-phase squirrel-cage electric motor.

6. A hydraulic operational system as set forth in claim 2, wherein the one of a steplessly regulated electric motor and a multi-stage electric motor is a three-phase servomotor.

7. A hydraulic operational system as set forth in claim 1, further comprising an electrically controlled pressure-limiting and unloading valve located downstream of the constant delivery pump and upstream of the hydraulic line network.

8. A hydraulic operational system as set forth in claim 2, further comprising a programmable control ramp circuit, the operation of which is based on a time/speed function, for regulating speed of the one of a steplessly regulated electric motor and a multi-stage electric motor.

9. A hydraulic operational system as set forth in claim 8, further comprising an electrically controlled pressure-limiting and unloading valve located downstream of the constant delivery pump and upstream of the hydraulic line network, the control ramp circuit also controlling operation of the pressure-limiting and unloading valve.

10. A hydraulic operational system as set forth in claim 2, wherein the one of a steplessly controlled electric motor and a multi-stage electric motor has a flange, and wherein the constant delivery pump is secured directly on the flange.

11. A hydraulic operational system as set forth in claim 2, further comprising a support for supporting the constant delivery pump and the one of a steplessly regulated electric motor and a multi-stage electric motor.

12. A hydraulic operational system as set forth in claim 2, wherein the plurality of hydraulic drives includes a closing cylinder, a height adjustment hydraulic motor, an ejection cylinder, an injection cylinder, a screw-driving cylinder, and at least one nozzle displacement cylinder.

13. A hydraulic operational system as set forth in claim 2, wherein the driving speed of the one of a steplessly regulated electric motor and a multi-stage electric motor is controlled within a speed range of 10–2500 revolution/min.

14. A hydraulic operational system as set forth in claim 13, wherein the controlled speed range is 120–1800 revolution/min.

15. A hydraulic operational system as set forth in claim 2, comprising control means for controlling the driving speed of the one of a steplessly regulated electric motor and a multi-stage electric motor in accordance with one of a set point and control point comparison, the control means comprising at least one of initiators, probes, and position sensors for determining conditions of at least one of the hydraulic drives and the directional control valves.

* * * * *